US011425497B2

(12) United States Patent
Salehin et al.

(10) Patent No.: US 11,425,497 B2
(45) Date of Patent: Aug. 23, 2022

(54) SPATIAL AUDIO ZOOM

(71) Applicant: QUALCOMM Incorporated, San Diego, CA (US)

(72) Inventors: S M Akramus Salehin, San Diego, CA (US); Lae-Hoon Kim, San Diego, CA (US); Vasudev Nayak, San Diego, CA (US); Shankar Thagadur Shivappa, San Diego, CA (US); Isaac Garcia Munoz, San Diego, CA (US); Sanghyun Chi, San Diego, CA (US); Erik Visser, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/127,421

(22) Filed: Dec. 18, 2020

(65) Prior Publication Data
US 2022/0201395 A1    Jun. 23, 2022

(51) Int. Cl.
*H04R 3/00* (2006.01)
*G06K 9/00* (2006.01)
*G02B 27/00* (2006.01)
*H03G 3/30* (2006.01)
*G06V 40/19* (2022.01)

(52) U.S. Cl.
CPC ......... *H04R 3/005* (2013.01); *G02B 27/0093* (2013.01); *G06V 40/19* (2022.01); *H03G 3/3005* (2013.01)

(58) Field of Classification Search
CPC ......... H04S 7/303; H04R 3/005; H04R 1/406; G02B 27/0093; G06K 9/00604; H03G 3/3005

USPC ............................................. 381/92, 91, 122
See application file for complete search history.

(56) References Cited

U.S. PATENT DOCUMENTS

| | | | | |
|---|---|---|---|---|
| 8,634,275 B2* | 1/2014 | Kondo | ................... | H04R 3/005 367/135 |
| 8,897,454 B2* | 11/2014 | Jeong | ..................... | H04N 5/232 381/26 |
| 9,232,146 B2* | 1/2016 | Kaneaki | ............. | H04N 5/23219 |
| 10,390,166 B2* | 8/2019 | Chen | ........................ | G06F 3/165 |
| 2002/0064287 A1* | 5/2002 | Kawamura | ............ | H04R 1/406 381/92 |
| 2005/0099511 A1* | 5/2005 | Cazier | ..................... | H03G 3/30 348/231.4 |

(Continued)

*Primary Examiner* — Xu Mei
(74) *Attorney, Agent, or Firm* — Qualcomm Incorporated

(57) ABSTRACT

In an aspect, a lens is zoomed in to create a zoomed lens. Lens data associated with the lens includes a direction of the lens relative to an object in a field-of-view of the zoomed lens and a magnification of the object resulting from the zoomed lens. An array of microphones capture audio signals including audio produced by the object and interference produced by other objects. The audio signals are processed to identify a directional component associated with the audio produced by the object and three orthogonal components associated with the interference produced by the other objects. Stereo beamforming is used to increase a magnitude of the directional component (relative to the interference) while retaining a binaural nature of the audio signals. The increase in magnitude of the directional component is based on an amount of the magnification provided by the zoomed lens to the object.

24 Claims, 11 Drawing Sheets

(56) References Cited

U.S. PATENT DOCUMENTS

| | | | |
|---|---|---|---|
| 2012/0163625 A1* | 6/2012 | Siotis | H04R 3/005 |
| | | | 381/92 |
| 2016/0241980 A1* | 8/2016 | Najaf-Zadeh | G06F 3/038 |
| 2017/0374486 A1* | 12/2017 | Killham | G06F 3/013 |
| 2020/0296279 A1* | 9/2020 | Kasugai | H04N 5/232939 |

\* cited by examiner

SPATIAL AUDIO ZOOM

BACKGROUND OF THE DISCLOSURE

1. Field of the Disclosure

Aspects of this disclosure relate generally to spatial audio zoom, and particularly to amplifying sound based on a zoom direction and magnification of a lens to create spatially zoomed audio in which audio in the zoom direction is magnified relative to interference.

2. Description of the Related Art

Video capture devices (e.g., smartphones, video cameras, and the like) include both a lens and a microphone to capture video (e.g., a sequence of frames taken at a particular frame rate, such as 15, 30, 60 frames per second (fps)) and the accompanying audio. Using the lens of the video capture device to zoom in on one or more objects of interest results in the objects of interest becoming magnified and occupying a larger portion of individual video frames. However, the microphone picks up sounds near the video capture device, regardless of how much the lens zooms in to the objects of interest. For example, a parent in an auditorium that includes other parents may capture a video of a child's piano recital and zoom the lens such that the child and at least a portion of the piano occupy the majority of each frame of the video. However, the microphone may pick up extraneous (e.g., non-piano) sounds near the parent's location, such as other parents talking, the squeak of chairs as the other parents shift in their seats, and the like. Such extraneous sounds may be at least as loud as the piano because the extraneous sounds may be generated closer to the microphone than the piano, even if the piano is being amplified using a public address system, because the speakers of the public address system may be further away from the microphone than the locations from where the extraneous sounds are emanating. Thus, while zooming a lens on an object of interest using a video capture device enables visual distractions to be reduced in the video frames, the microphone picks up extraneous sounds from nearby sources, thereby creating interference with the audio emanating from the object of interest.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a lens is zoomed in to create a zoomed lens. Lens data associated with the lens includes a direction of the lens relative to an object in a field-of-view of the zoomed lens and a magnification of the object resulting from the zoomed lens. An array of microphones capture audio signals including audio produced by the object and interference produced by other objects. The audio signals are processed to identify a directional component associated with the audio produced by the object and three orthogonal components associated with the interference produced by the other objects. Stereo beamforming is used to increase a magnitude of the directional component (relative to the interference) while retaining a binaural nature of the audio signals. The increase in magnitude of the directional component is based on an amount of the magnification provided by the zoomed lens to the object.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit (s) of a reference number identifies the figure in which the reference number first appears. The same reference numbers in different figures indicate similar or identical items.

DETAILED DESCRIPTION

Figure 1:
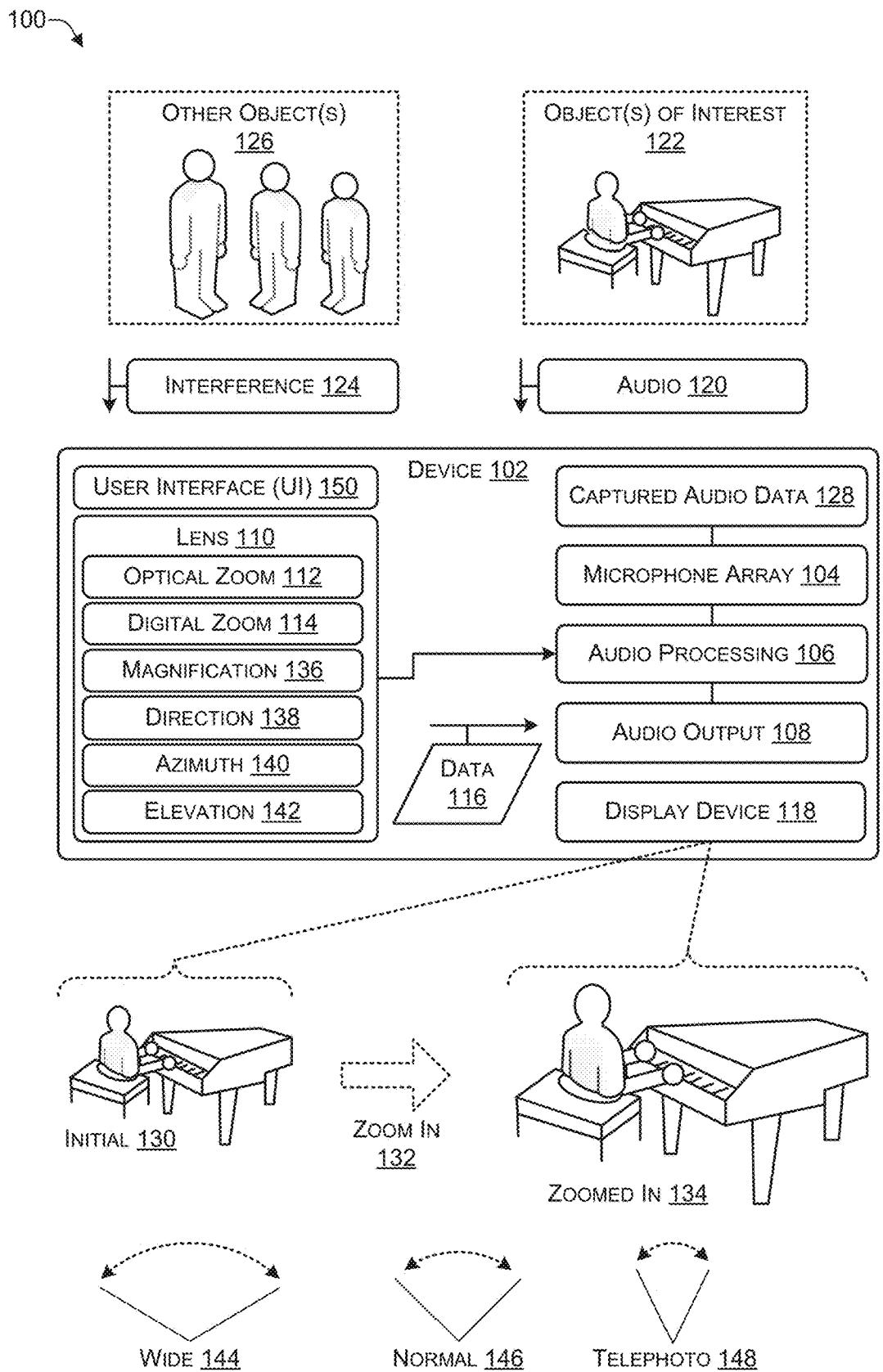
FIG. 1 is a block diagram that includes a device zooming in on an object of interest and using audio processing to amplify audio from the object of interest, according to various aspects of the disclosure.

Disclosed are systems and techniques to determine a direction and a magnification associated with a lens focused on an object of interest and processing the audio to perform a spatial audio zoom in which sound emanating from the object of interest is amplified relative to a volume of the audio interference caused by noises emanating from other objects. The spatial audio zoom is performed in a way that the resulting binaural audio signal retains the spatial cues (e.g., front, back, left, right) of the original audio signal. The audio emanating from the object of interest is increased by a magnification factor (e.g., based on an amount of magnification provided by the lens) while a volume and direction of interference (e.g., noise) produced by other objects remain relatively unaffected. Thus, the volume of the audio from the object of interest is increased relative to interference provided by other objects.

A device (e.g., smartphone, video camera, or the like) that is capable of video capture includes a lens and a microphone array (typically at least 3 microphones and preferably 4). When a user uses the lens to zoom in on an object of interest, the device determines data, such as the direction of the zoom and the magnification resulting from the zoom, and processes audio received from the microphone array to perform a spatial audio zoom. For example, based on the zoom direction, the device uses beamforming to determine first order ambisonic (FOA) coefficients. Unliked conventional beamforming, which results in a mono signal, the result of the beamforming is binaural audio. The device determines a first directive (e.g., directional) FOA coefficient associated with the audio from the object of interest and determines a remaining (e.g., three) directive FOA coefficients that are orthogonal to the first FOA coefficient and are associated with interference (e.g., created by objects other than the object of interest). After beamforming, a generalized sidelobe canceller (GSC) may be used to modify the first directive (e.g., directional) FOA coefficient based on the remaining (e.g., orthogonal) directive FOA coefficients to isolate the audio of interest based on the position (e.g., in 3-dimensional space) of the object of interest. The GSC modifies the first directive (e.g., directional) FOA coefficient by reducing the amount of interference (the orthogonal directive FOA coefficients).

A filter may be used to magnify (e.g., increase an amplitude of) the first directive (e.g., directional) FOA coefficient based on the direction of the lens to create a filtered signal. A binaural signal derived from the audio received from the microphone array is convolved with the filtered signal and compressed using a multi-band dynamic range compressor (MBDRC) to provide a binaural output signal in which the audio from the object of interest has a greater volume than other audio signals (e.g., interference) received by the microphone array. In this way, a user zooming in on an object of interest hears a corresponding audible zoom (e.g., increase in amplitude) of the audio produced by the object of interest while retaining the binaural characteristics of the audio signal. For example, interference generated by objects to the left and to the right of the object of interest may be audible in the zoomed audio signal on the left and on the right, respectively.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

For example, a device may include a lens, a microphone array, one or more processors, and a computer-readable medium to store instructions executable by the one or more processors to perform various operations. For example, the operations include determining that a field-of-view of the lens has been zoomed in from a first field-of-view to a second field-of-view to create a zoomed lens. The second field-of-view is narrower than the first field-of-view. The operations include determining lens data associated with the zoomed lens. The lens data includes a direction and a magnification associated with the zoomed lens. The operations include receiving audio signals from the microphone array. The operations include converting the audio signals to a binaural signal. The operations include compressing, by a first multiband dynamic range compressor, the binaural signal to create a first compressed signal. The operations include determining, based on the audio signals, a set of first order ambisonic coefficients. The operations include determining, based on the direction, a directive (e.g., directional) component of the set of first order ambisonic coefficients. The operations include determining, based on the direction, three orthogonal components of the set of first order ambisonic coefficients, where the three orthogonal components are orthogonal to the directive component of the set of first order ambisonic coefficients. The operations include filtering, based on the magnification, the binaural signal to increase an amplitude of sounds in the lens direction to create a magnified signal. The operations include convolving the binaural signal and the magnified signal to create a convolved signal. The operations include compressing, by a second multiband dynamic range compressor, the convolved signal to create a second compressed signal. The operations include selecting, based on particular criteria, either the first multiband dynamic range compressor or the second multiband dynamic range compressor to produce a selected signal. The operations include outputting the selected signal. The lens data further includes an azimuth and an elevation. Converting the audio signals to the binaural signal includes converting the audio signals to first order ambisonic signals and converting, based on the azimuth and the elevation, the first order ambisonic signals to the binaural signal. Determining, based on the audio signals, the set of first order ambisonic coefficients includes performing, based on the direction, a first beamforming to determine the directive (e.g., directional) component of the set of first order ambisonic coefficients, performing, based on the direction, a second beamforming to determine the three orthogonal components of the set of first order ambisonic coefficients, and modifying, using a sidelobe canceller and based on the three orthogonal components, the directive component to reduce interference in the directive (e.g., directional) coefficient. The operations further include filtering the set of first order ambisonic coefficients. The filtering includes determining a ratio of (1) the directive component to (2) a sum of: (i) the directive component and (ii) the three orthogonal components. The filtering includes, based on determining that the ratio is less than 1, setting (e.g., increasing) the ratio to 1 to create a filtered signal. The ratio may be set to 1 by increasing the directive component, decreasing one or more of the three orthogonal components, or a combination of both. The operations include performing a linked mode convolution in which a left channel of the binaural signal is convolved with the filtered signal to create a left convolved signal, and a right channel of the binaural signal is convolved with the filtered signal to create a right convolved signal. Selecting, based on the particular criteria, either the first multiband dynamic range compressor or the second multiband dynamic range compressor to produce the selected signal includes determining whether the second compressed signal exceeds a distortion threshold. If the second compressed signal exceeds the distortion threshold, then the first multiband dynamic range compressor is selected to produce the first compressed output as the selected signal. If the second compressed signal fails to exceed the distortion threshold, then the second multiband dynamic range compressor is selected to produce the second compressed output as the selected signal. The microphone array comprises at least three microphones including, for example, a first microphone located on a front of the device, a second microphone located on a back of the device, and a third microphone located on a side of the device. The second field-of-view includes an object of interest. The direction indicates an orientation of the lens relative to the object of interest. The directive (e.g., directional) component is associated with audio produced by the object of interest and the three orthogonal components are associated with interference produced by other objects.

FIG. 1 is a block diagram 100 that includes a device zooming in on an object of interest and using audio processing to amplify audio from the object of interest, according to various aspects of the disclosure. The device 102 may be a smartphone, a video camera, a virtual reality capture device (e.g., "glasses" that include microphones and lenses, such as Google® Glass), or another type of device capable of capturing video. As used herein, the term video refers to (1) a sequence of frames (e.g., images) taken at a particular time interval (e.g., 5, 10, 15, 30, 60 or greater frames per second (fps)) and (2) audio that is captured during the time the frames are captured.

The device 102 may include a microphone array 104 (e.g., 3 or more microphones), audio processing 106, audio output 108, a lens 110, and a display device 118. The lens 110 may include an optical zoom 112, a digital zoom 114, or a combination of both. For example, the optical zoom 112 may use a lens whose focal length can be optically modified. In some cases, during the zooming, the optical zoom 112 may smoothly transition from a first focal length to a second focal length that is different from the first focal length. In other cases, the optical zoom 112 may select from one of multiple optical lenses. For example, a smartphone may use three lenses, a wide lens (less than 40 millimeters (mm) equivalent) having a wide 144 field-of-view (FOV), a normal lens (e.g., capable of a field of view that human beings normally have, between about 40 mm to 60 mm) with a normal 146 field-of-view, and a telephoto lens (e.g., greater than 60 mm) with a telephoto (e.g., narrow) 148 field-of-view. As the field-of-view narrows from the wide 144, to the normal 146, to the telephoto 148, a magnification of an object in the field-of-view increases. In such cases, zooming in the optical zoom 112 may include modifying the lens 110 by transitioning from a first lens to a second lens that has a narrower field-of-view than the first lens, such as from the wide 144 to the normal 146 or from the normal 146 to the telephoto 148. The digital zoom 114 crops image data so that an object is magnified and thus appears larger. When zooming the lens 110, the device 102 may use the optical zoom 112, the digital zoom 114 or a combination of both. For example, as the lens 110 is zoomed in, the device 102 may increase the optical zoom 112 to a maximum telephoto length. If a user continues to zoom in the lens 110 for additional magnification, the device 102 may use the digital zoom 114 to crop image data to further narrow the field-of-view and increase magnification. Thus, zooming in the lens 110 may include using the optical zoom 112, using the digital zoom 114, or a combination of both to increase the focal length and decrease the field-of-view to magnify one or more objects within the field-of-view. Zooming out the lens 110 may include using the optical zoom 112, using the digital zoom 114, or a combination of both to decrease the focal length and increase the field-of-view to reduce a magnification one or more objects within the field-of-view.

The audio processing 106 may be performed using software (including firmware), hardware (e.g., a digital signal processor (DSP) or the like), or a combination of both software and hardware. The microphone array 104 includes multiple (e.g., 3 or more) microphones and may be capable of capturing audio signals that can be used for Ambisonic audio. The audio 120, 122 are analog signals that are converted to digital signals and stored as the captured audio data 128. The sampling frequency used to perform the analog to digital conversion may be 12, 16, 24, or 48 kiloHertz (kHz).

The audio processing 106 may use data 116 associated with the lens 110 to perform at least a portion of the audio processing 116. The data 116 may include, for example, a magnification 136 associated with the lens 110, a direction 138 associated with the lens 110, an azimuth 140 associated with the lens 110, and an elevation 142 associated with the lens 110. In some cases, such as when the device 102 is a smartphone, the device 102 may include a user interface (UI) 150 to enable a user to, when zooming in, specify which portion of the display device 118 (e.g., a touchscreen display) to magnify and how much magnification to apply. For example, to zoom in on an object being displayed on the display device 118, the user may use the UI 150 to select the object by tapping or circling a portion of the display device 118 displaying the object and then perform a pinch out on the touchscreen of the display device 118 to magnify (e.g., zoom in on) the object.

The audio processing 106 may use the data 116 to increase a volume of (e.g., magnify) audio 120 produced by one or more objects of interest 122 relative to a volume of interference 124 produced by other objects 126. For example, the device 102 uses the microphone array 104 to capture the audio 120 and the interference 124 as captured audio data 128. The device 102 performs the audio processing 106 to perform spatial zooming of the captured audio data 128, in which a volume of the audio 122 is increased relative to the interference 126 while retaining spatial queues in the resulting binaural signal. After the audio processing 106 has been completed, the resulting audio signal is provided to the audio output 108. The audio output 108 may include a headphone jack, a speaker (e.g., a transducer), a wireless transmitter that can wirelessly (e.g., using Bluetooth® or the like) transmit the resulting audio signal to an external device, such as, for example, a pair of wireless headphones or a wireless speaker.

While a single object of interest 122 is illustrated, it should be understood that more than one object of interest (e.g., multiple people playing multiple instruments) may be in the field-of-view of the lens 110. While the other objects 126 are illustrated as being on a left side of the objects of interest 122, it should be understood that the other objects 126 may be in other locations including, for example, to the right of the object of interest 122, behind the device 102, to the left of the device 102, to the right of the device 102, above the device 102, below the device 102, located at another spatial position different from a location of the object of interest 122 or any combination thereof.

As the lens 110 is zoomed in, a magnification of the object of interest 122 is increased. For example, the display device 118 of the device 102 may display an initial image 130 associated with the object of interest 122. After a zoom in 132 is performed of the lens 110, the display device 118 displays a magnified object of interest 122 (e.g., as compared to the initial image 130), as illustrated in the zoomed image 134.

The magnification 136 indicates an amount of magnification performed to the object of interest 122. The direction 138 indicates a direction of the object of interest 122 relative to the lens 110. The direction 138 is such that at least a portion of the object of interest 122 is included in a field-of-view of the lens 110.

While the examples herein describe using the device 102 to capture video, the systems and techniques described herein may be used to capture audio signals (e.g., without the video frames). For example, the UI 150 may enable a user of the device 102 to perform an audio zoom on the captured audio data 128.

Thus, a device capable of capturing video may include a zoom lens. The zoom lens may use an optical zoom, a digital zoom, or a combination of both. When capturing video, a user moves the lens such that the direction of the lens is towards an object of interest (OOI), e.g., OOI is within a field-of-view of the lens. When the lens is zoomed in to magnify the OOI in the field-of-view, the device determines the direction of the lens and the amount of magnification. The device performs audio processing, based on the direction and the amount of magnification, to increase an amplitude of audio produced by the OOI relative to interference produced by other objects in the area. In this way, zooming in a lens on the OOI causes a corresponding zooming of the audio produced by the OOI. The device can capture video that includes (1) frames in which the OOI is magnified and (2) audio in which the OOI audio has a volume greater than other audio signals received by the microphone.

In FIGS. 2, 3, 4, and 5, it should be understood that when an arrow goes from a first block to a second block, the arrow indicates that a result (e.g., output) of operations performed by the first block are provided as input to the second block. Some intermediate signals, e.g., output of the first block that is provided as input to the second block, are shown. However, if not explicitly shown, such intermediate signals should be understood as travelling in the direction illustrated by each arrow.

Ambisonic audio represents a 360-degree sound field using four channels in a first order Ambisonic (FOA) format (also known as a B-format). The four channels in FOA are referred to as W, X, Y and Z. Each represents a different directionality in the 360-degree sphere: center, left-right, front-back, and up-down. Mathematically, each of the four channels represent a different spherical harmonic component, e.g., a different microphone polar pattern pointing in a specific direction, with the four being coincident.

W is an omni-directional polar pattern, containing all sounds in a sphere, coming from all directions at equal gain and phase.

Figure 8:
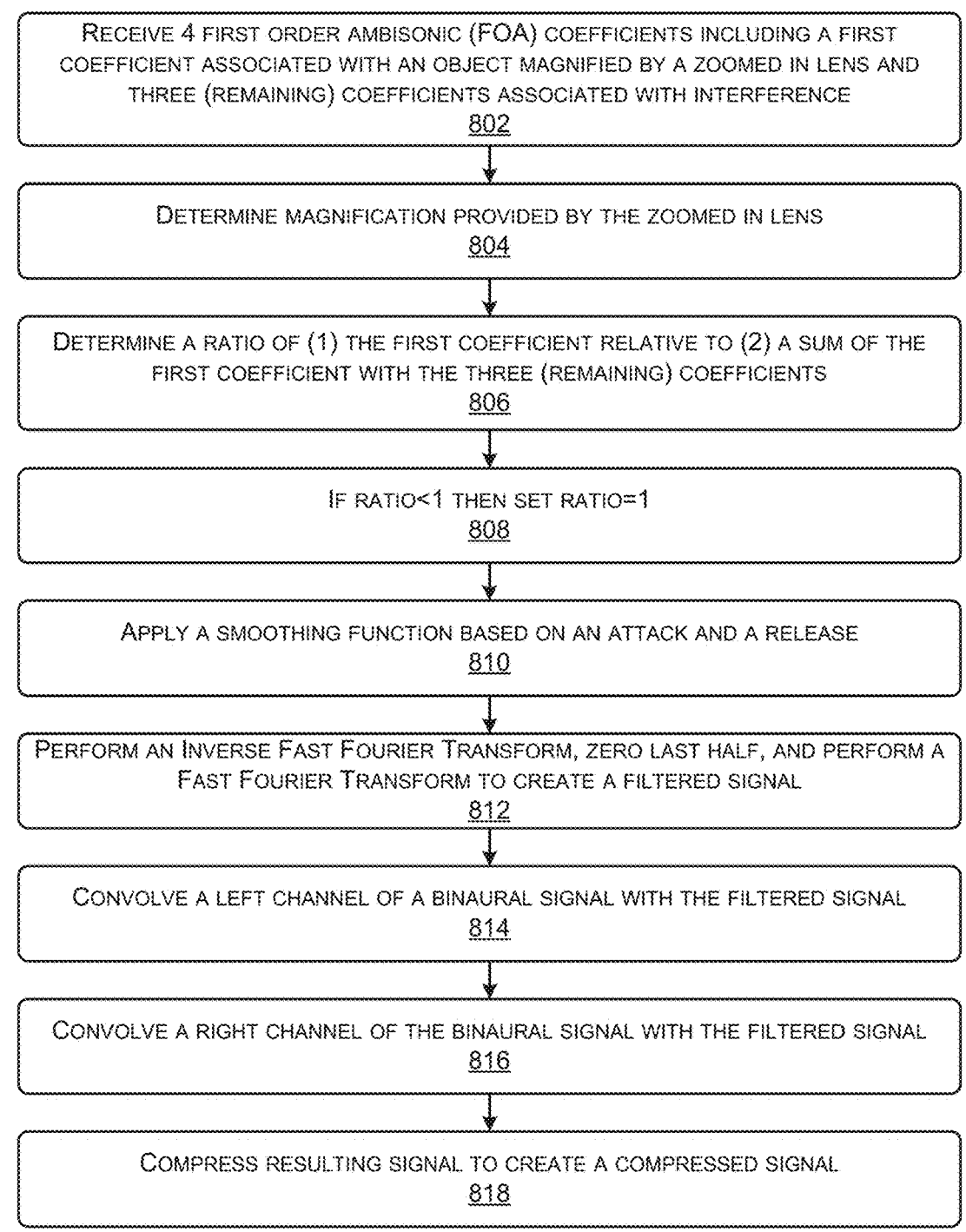
FIG. 8 illustrates an example process that includes individually convolving a left channel and a right channel of a binaural signal, according to aspects of the disclosure.

X is a figure-8 bi-directional polar pattern for forward (e.g., positive) and backward (e.g., negative).

Y is a figure-8 bi-directional polar for left (e.g., positive) and the right (e.g., negative).

Z is a figure-8 bi-directional polar pattern for up (e.g., positive) and down (e.g., negative).

Binaural audio refers to an audio signal having 2 channels, e.g., a left channel and a right channel. The binaural audio is used to create a 3-dimensional (3-D) stereo sound experience in which a listener experiences the audio in a manner similar to actually being in the room with the musicians.

The systems and techniques described herein use Ambisonic audio to manipulate the phase, frequency, or both of the audio 120 to be louder relative to the interference 124. For example, if the object of interest 122 is directly in front of the lens 110 and the lens 110 is zoomed to a 2× magnification, then the systems and techniques determine, using FOA, that the X portion of the FOA, which is pointing forward (positive), includes the audio 120 and manipulates the captured audio data 128 substantially in real-time to increase the volume of the audio 120 relative to the interference 124.

Figure 2:
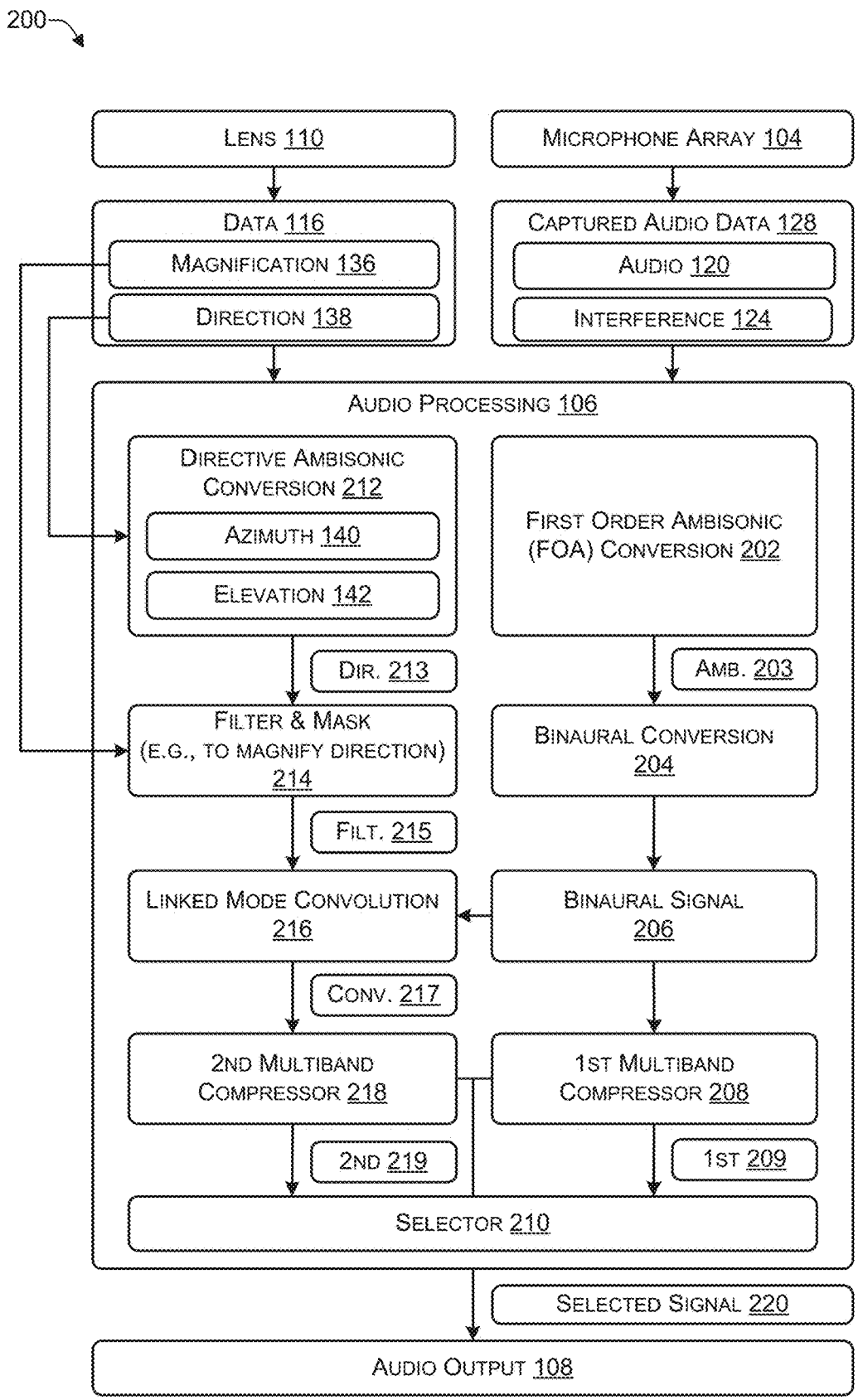
FIG. 2 is a block diagram to perform audio processing, according to aspects of the disclosure.

FIG. 2 is a block diagram 200 to perform audio processing, according to aspects of the disclosure. The microphone array 104 provides the captured audio data 128 that includes the audio 120 and the interference 124 to the audio processing 106.

The data 116 associated with the lens 110 includes the magnification 136 provided by the lens 110 and the lens direction 138 that indicates a direction of the object(s) of interest 122 of FIG. 1. The audio processing 106 may use the data 116 to process the captured audio data 128 to increase a volume of the audio 120 while leaving the volume of the interference 124 unchanged.

The audio processing 106 performs an FOA conversion 202 to the captured audio data 128 to create an FOA Ambisonic signal 203. A binaural conversion 204 is performed on the Ambisonic signal 203 to create a binaural signal 206. A first multiband compressor 208 (e.g., multiband dynamic range compressor (MBDRC)) may be used to compress the binaural signal 206 to create a first compressed signal 209. The first compressed signal 209 includes the pre-zoomed audio 120.

Figure 3:
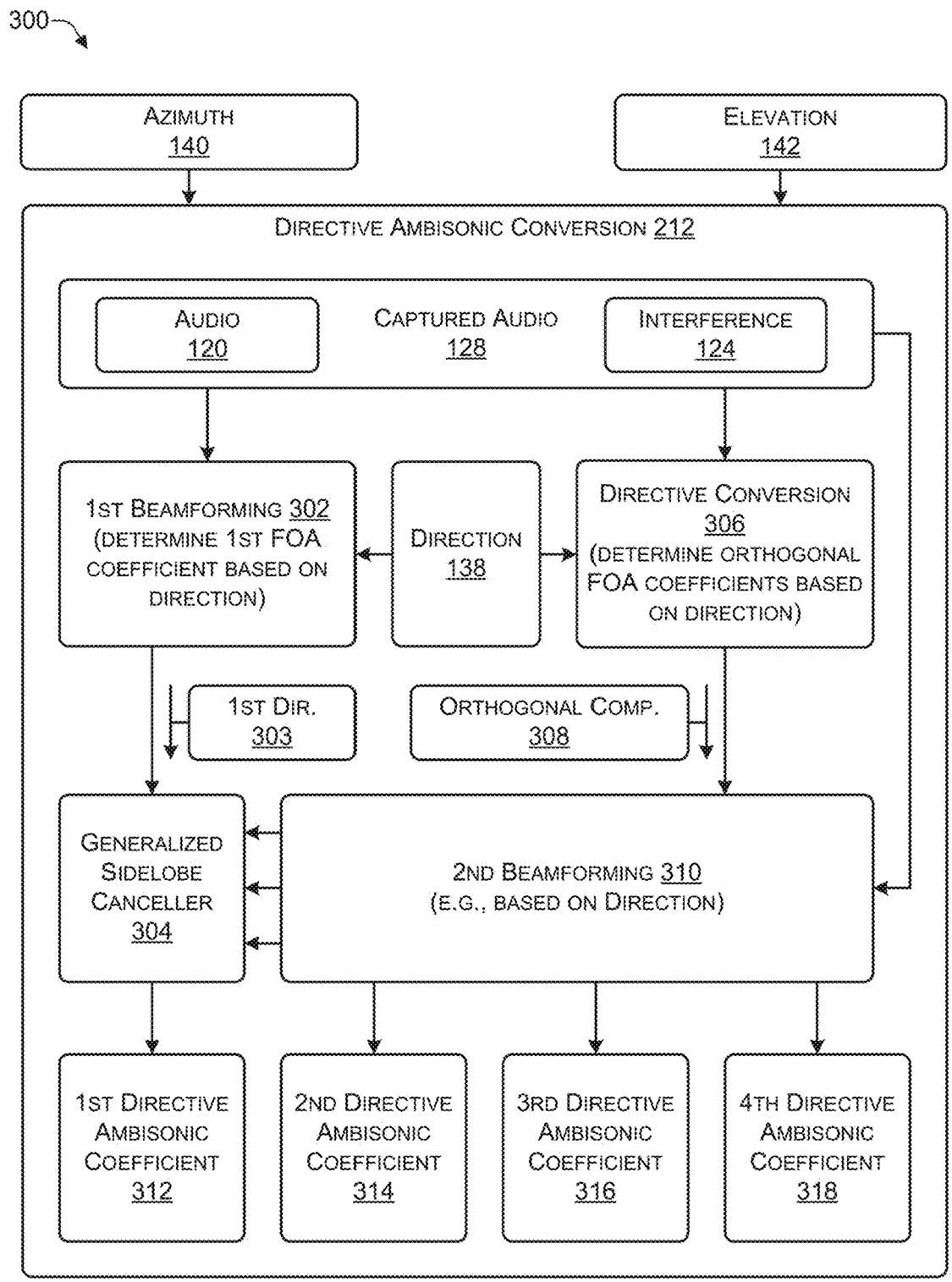
FIG. 3 is a block diagram to perform directive ambisonic conversion, according to aspects of the disclosure.

The captured audio data 128 undergoes directive Ambisonic conversion 212 (described in more detail in FIG. 3). The directive Ambisonic conversion 212 uses the azimuth 140, the elevation 142, and the lens direction 138 during the conversion to determine a directive Ambisonic signal 213. The directive Ambisonic signal 213 includes a first Ambisonic signal that includes the audio 120 and three Ambisonic signals orthogonal to the first Ambisonic signal that include the interference 124.

A filter and a mask 214 are used to modify the directive Ambisonic signal 213 to create a filtered signal 215 in which the directive Ambisonic signal 213 is magnified. A linked mode convolution 216 is performed by performing convolution of the filtered signal 215 with the binaural signal 206 to create a convoluted signal 217. In this way, the linked mode convolution 216 preserves the binaural aspects of the signal. The convoluted signal 217 may undergoes compression using a second multiband compressor 218 to create a second compressed signal 219. The second compressed signal 219 includes a spatially zoomed binaural signal in which the volume of the audio 120 has been increased.

A selector 210 selects, based on criteria, either the first multiband compressor 208 or the second multiband compressor 218. Based on the selection, a selected signal 220 is output via the audio output 108. The selected signal 220 is the first compressed signal 209 when the selector selects the first multiband compressor and the selected signal 220 is the second compressed signal 29 when the 2nd multiband compressor 218 is selected.

The multiband compressors 208, 218 may use multiple frequency bands, such as for example, 3 bands, 4 bands, 8 bands, or the like. Each of the multiband compressors 208, 218 include a set of filters that split the audio signal into multiple frequency bands. After passing through the filters, each frequency band is fed into its own compressor, after which the signals are recombined. An advantage of multiband compression is that a loud event in one frequency band does not cause a reduction in gain in the other bands. For example, a 3-band compressor may use 20 to 120 Hertz (Hz) as a low band, above 120 Hz to 2.5 kilohertz (kHz), as a mid-band, and above 2.5 khz (e.g., up to 20 kHz) as a high band. The mid-band includes frequencies produced by the human voice to provide improved voice clarity.

FIG. 3 is a block diagram 300 to perform directive ambisonic conversion, according to aspects of the disclosure. The directive Ambisonic conversion 212 is performed based on the direction 138, the azimuth 140, and the elevation 142 associated with the lens 110 of FIG. 1.

The direction 138 is used when performing first beamforming 302 to the captured data 128 to determine a first directive (e.g., directional) Ambisonic component 303 that is provided to a generalized sidelobe canceller (GSC) 304. The first directive (e.g., directional) Ambisonic component 303 is associated with the audio 120 (e.g., produced by the object of interest 122 of FIG. 1) and determined based on the direction 138 of the lens 110.

Directive conversion 306 is performed on the captured audio 128 to determine orthogonal FOA coefficients. The directive conversion 306 identifies, based on the lens direction 138, three FOA orthogonal components 308 associated with the interference 124. Second beamforming 310, based on the lens direction 138, is performed on the three FOA orthogonal components 308 to determine a second directive Ambisonic coefficient 314, a third directive Ambisonic coefficient 316, and a fourth directive Ambisonic coefficient 318. The Ambisonic coefficients 314, 316, 318 are associated with the interference 124.

The Ambisonic coefficients 314, 316, 318 are provided to the generalized sidelobe canceler 304. The generalized sidelobe canceler (GSC) 304 reduces an effect of the orthogonal Ambisonic coefficients 314, 316, 318 on the first directive Ambisonic component 303 to create a first directive (e.g., directional) Ambisonic coefficient 312.

The beamforming 302, 206 (also called spatial filtering) is a signal processing technique used for directional signal reception by combining elements in such a way that signals at particular angles experience constructive interference (e.g., increasing an amount of the audio 120) while others experience destructive interference (e.g., decreasing an amount of the interference 124).

Figure 4:
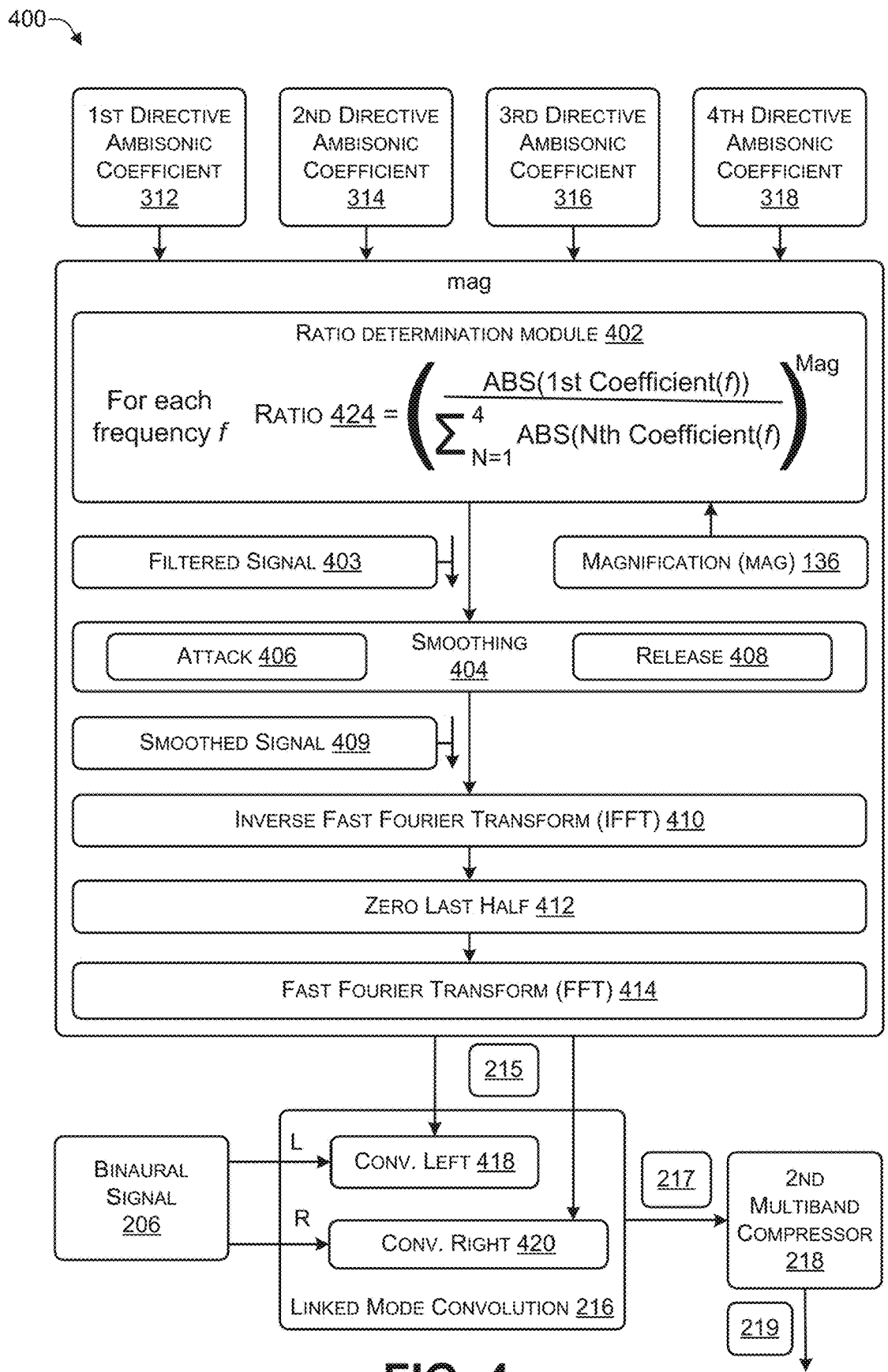
FIG. 4 is a block diagram to convolve audio signals to increase a magnitude of audio received from a particular direction, according to aspects of the disclosure.

FIG. 4 is a block diagram 400 to convolve audio signals to increase a magnitude of audio received from a particular direction, according to aspects of the disclosure. A ratio determination module 402 determines, for each frequency f, a ratio 424

$$\text{RATIO } 424 = \left( \frac{\text{ABS}(1st \text{ Coefficient}(f))}{\sum_{N=1}^{4} \text{ABS}(Nth \text{ Coefficient}(f))} \right)^{Mag}$$

where ABS determines an absolute value and mag=magnification 136.

The equation shown above is one way in which the ratio determination module 402 may determine the ratio. For example, in some cases, a different exponent other than the magnification may be used, or no exponent may be used.

The frequencies f that are used may be 256 frequencies, 512 frequencies, or the like. If the ratio 424 of the numerator to the denominator, as determined using the equation above, is less than one, than the ratio determination module 402 sets the ratio to 1. The ratio 424 may be set to 1 by increasing the directive component, decreasing one or more of the three orthogonal components, or a combination of both. At each frequency, the ratio 424 represents a magnitude of the 1st directive (e.g., directional) ambisonic coefficient (associated with the audio 120 of the object of interest 122 of FIG. 1) relative to a sum of the directive ambisonic coefficients 312, 314, 316, 318. In some cases, the sum of the directive ambisonic coefficients 312, 314, 316, 318 may have an exponent of the magnification 136 of the lens 110.

If the ratio 424 of the numerator to the denominator is less than 1, e.g., the volume of the audio 120 is less than the volume of the audio 120 plus the volume of the interference 124. In such cases, the ratio 424 is set to 1 to prevent the audio 120 from overwhelming the interference 124 as the interference 124 may include audio information associated with the audio 120, such as echoes of the audio 120 bouncing off of walls, floors, ceiling, or the like that provides reverberation based on the acoustics of the room and other spatial information.

The output of the ratio determination module 402 is a filtered signal 403 that is smoothed using a smoothing function 404 that operates based on an attack 406 and a release 408 to create a smooth signal 409. The release 408 may be 100 milliseconds to 1 second and the attack may be between about ⅒ to about ⅕ of the amount of the release. For example, if the release 408 is 1 second, then the attach 406 is between 0.1 to 0.2 seconds. The smoothing 404 acts to reduce sudden changes caused by changing the ratio in 402.

An inverse fast Fourier transform (IFFT) 410 is performed on the smooth signal 409, a last half of a result of the IFFT 410 is set zero and a fast Fourier transform (FFT) 414 is performed to mask the smoothed signal 409.

The results from the FFT 414 are convolved with each channel of the binaural signal 206 using the link mode convolution 216. Thus, the same filter is used for both a right channel and a left channel to preserve the binaural nature of the audio, including spatial queues. For example, a left (L) channel of the binaural signal 206 undergoes a convolution left 418, and a right (R) channel of the binaural signal 206 undergoes a convolution right 420. The result of the link mode convolution 216 is processed using the second multiband compressor 218 to create the second compressed signal 219.

Figure 5:
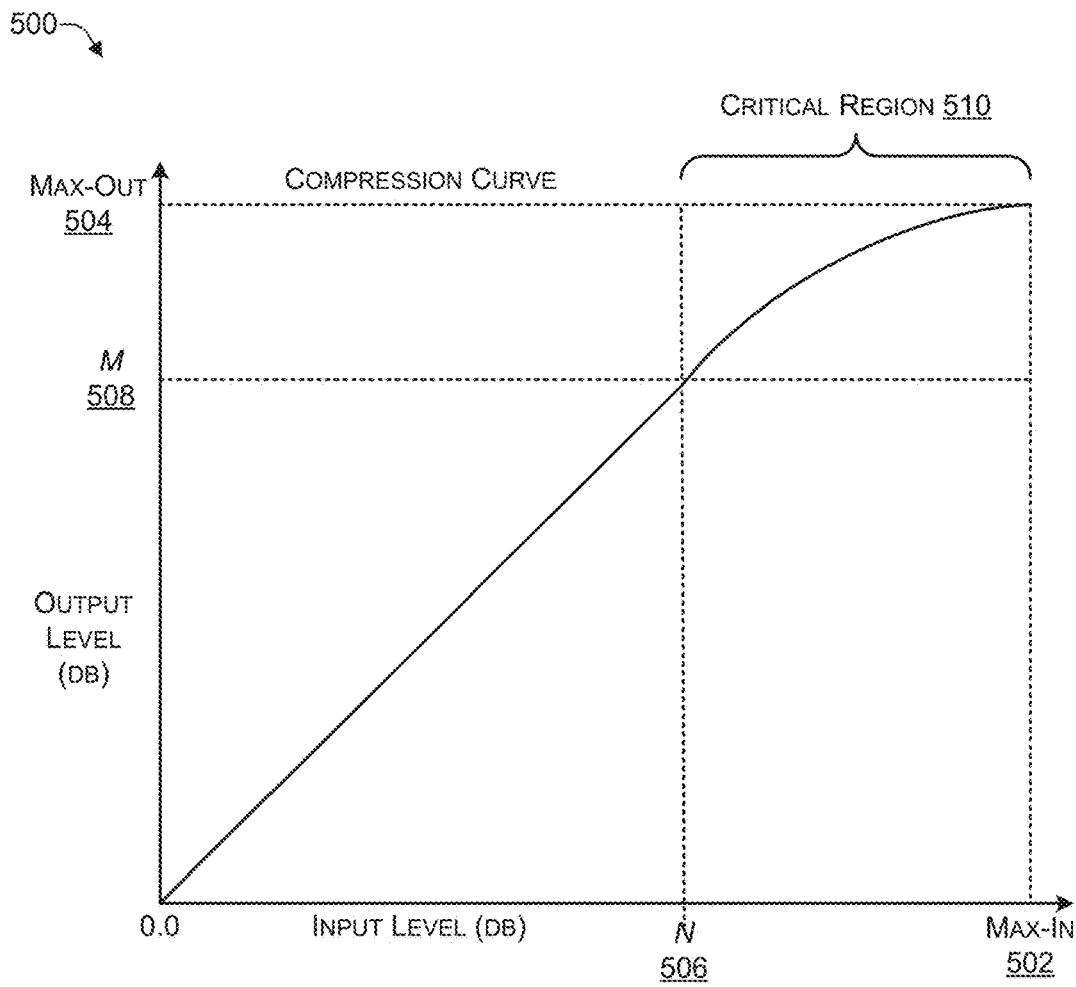
FIG. 5 illustrates selecting a first compressor or a second compressor based on a compression curve, according to aspects of the disclosure.
Figure 5:
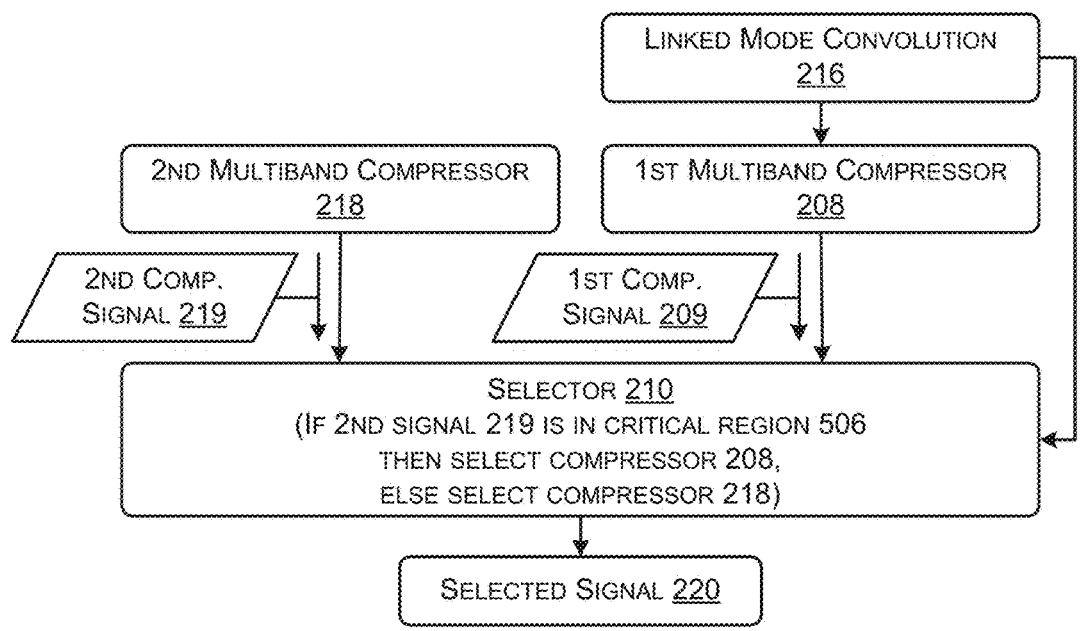

FIG. 5 illustrates selecting a first compressor or a second compressor based on a compression curve 500, according to aspects of the disclosure. The compression curve 500 includes an input level in decibels (dB) on an x-axis and an output level in dB on a y-axis. The x-axis includes a Max-In 502 identifying a maximum input level and the y-axis includes a Max-Out 504 identifying a maximum output level. When the input level exceeds a first threshold N 506 and the output level exceeds a second threshold M 508, then the compression curve 500 enters into a critical region 510 in which distortion may occur. The thresholds N 506 and M 508 may be selected based on the ratio of the first directive coefficient 312 to the sum of the orthogonal directive coefficients 314, 316, 318 because the more the first directive (e.g., directional) coefficient 312 is magnified (e.g., amplified) the greater the possibility of distortion (e.g., clipping or other artifacts) being introduced into the second compressed signal 219.

The selector 210 determines if the second compressed signal 219, that includes the magnified audio 120, is in the critical region 510. If the second compressed signal 219 is in the critical region 510, then the selector 210 selects the first multiband compressor 208 (e.g., un-zoomed audio). If the second compressed signal 219 is not in the critical region 510, then the selector 210 selects the second compressor 218 (e.g., zoomed audio). Thus, the selector 210 continually monitors to determine if the zoomed audio signal (e.g., the second compressed signal 219) includes distortion. The selector 210 may use a lookahead function to enable the selector 210 to smoothly switch from the first compressed signal 209 (e.g., un-zoomed audio) to the second compressed signal 219 (e.g., zoomed audo).

Figure 6:
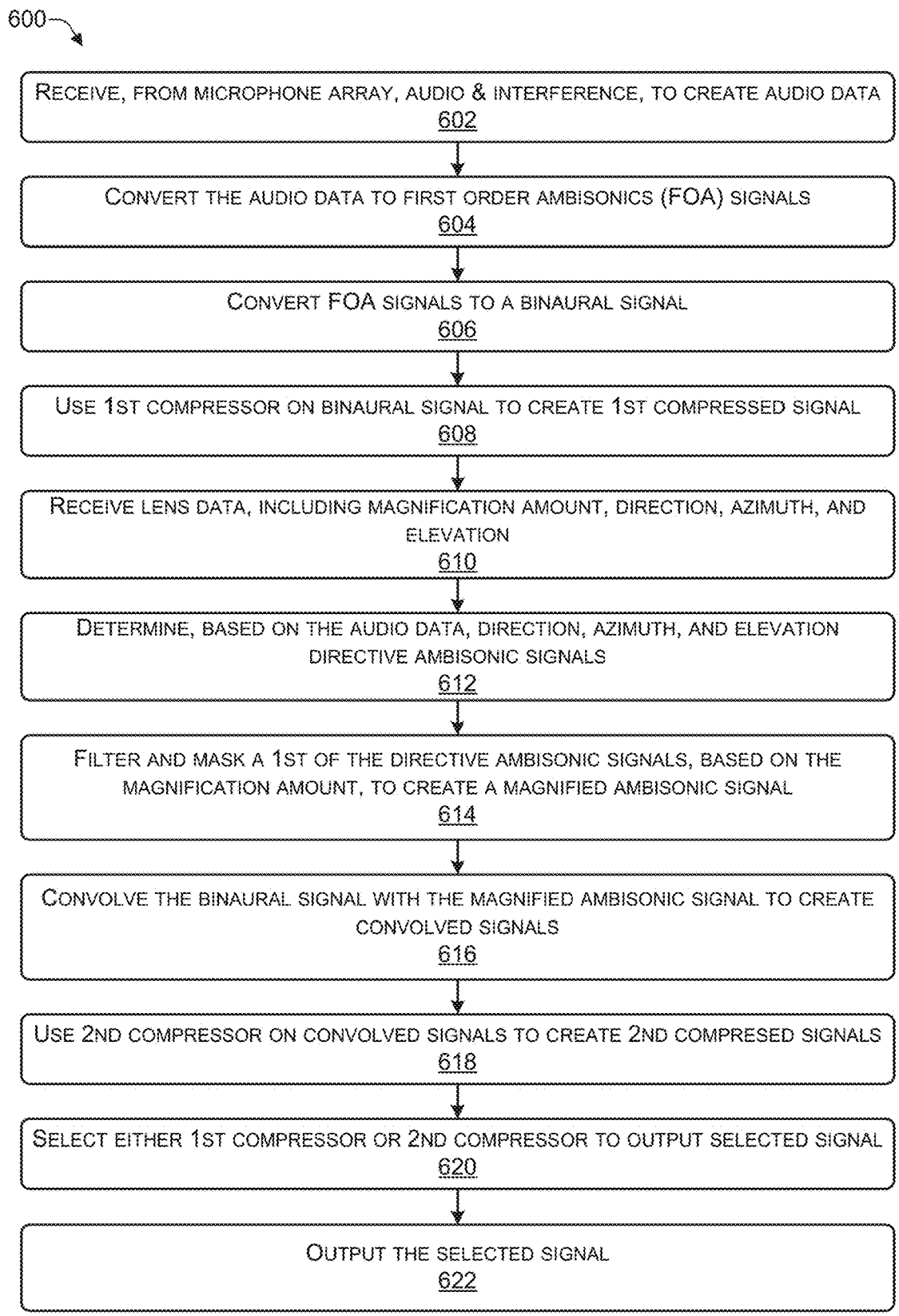
FIG. 6 illustrates an example process to perform audio processing to increase a magnitude of audio emanating from a particular direction, according to aspects of the disclosure.
Figure 7:
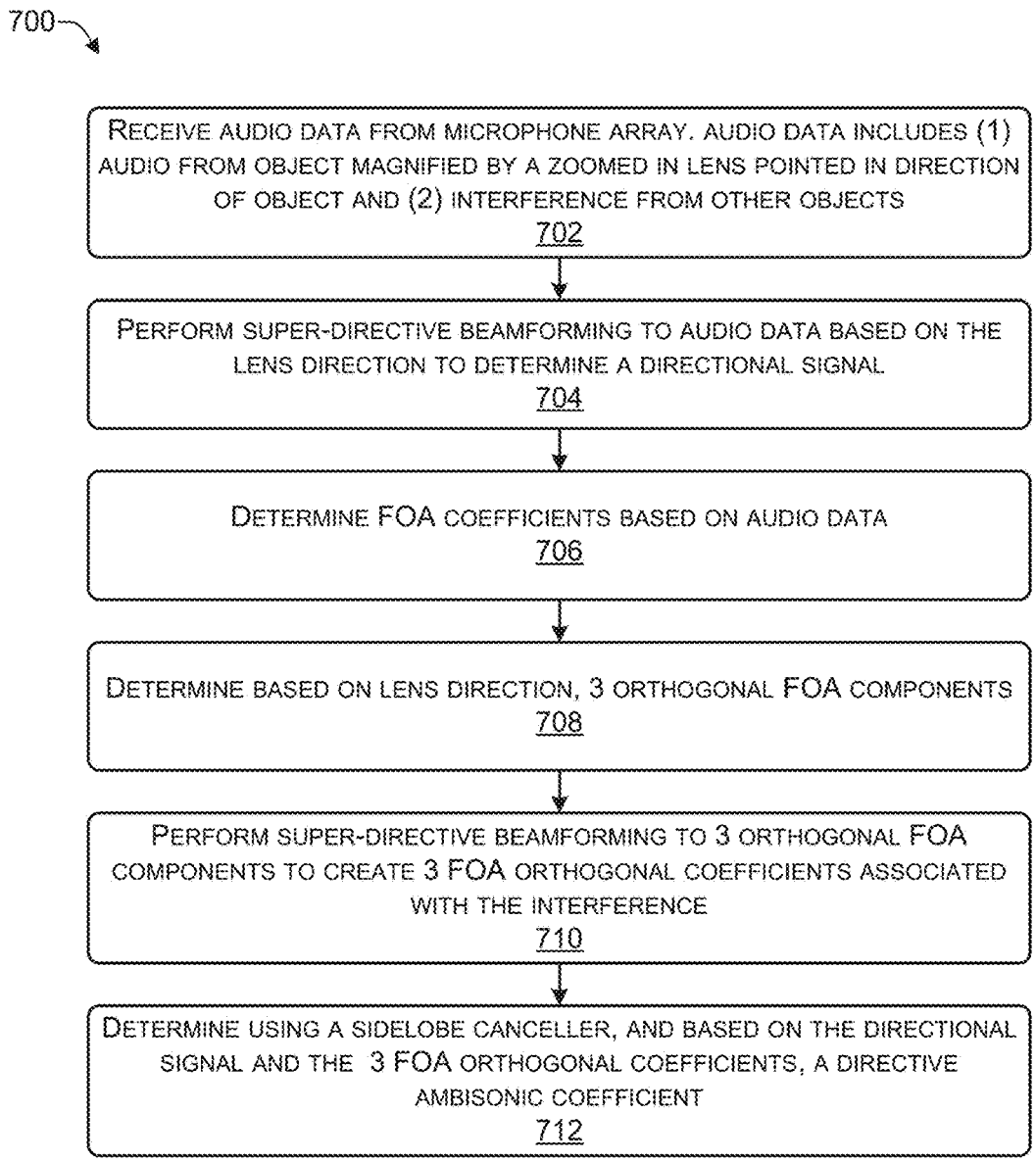
FIG. 7 illustrates an example process to determine directive Ambisonic coefficients, according to aspects of the disclosure.

In the flow diagrams of FIGS. 6, 7, and 8, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 600, 700, and 800 are described with reference to FIGS. 1, 2, 3, 4, and 5 as described above, although other models, frameworks, systems and environments may be used to implement these processes.

FIG. 6 illustrates an example process 600 to perform audio processing to increase a magnitude of audio emanating from a particular direction, according to aspects of the disclosure. The process 600 is performed by the audio processing 106 of FIGS. 1 and 2.

At 602, the process receives, from a microphone array, audio data that includes an audio signal (e.g., from an object of interest) and interference (e.g., from other objects). At 604, the process converts the audio data to first order Ambisonic (FOA) signals. At 606, the process converts the FOA signals to a binaural signal. At 608, the process uses a first compressor (e.g., to perform MBDRC) to compress the binaural signal to create a first compressed signal. For example, in FIG. 1, the microphone array 104 captures the audio 120 from the object of interest 122 and the interference 124 from the other objects 126 (e.g., within a particular distance from the device 102) to create the captured audio data 128. In FIG. 2, the FOA conversion 202 converts the captured audio data 128 to the Ambisonic signal 203. The binaural conversion 204 converts the Ambisonic signal 203 into the binaural signal 206. The first multiband compressor 208 compresses the binaural signal 206 to create the first compressed signal 209.

At 610, the process receives lens data, including a magnification amount, a direction (e.g., a direction of the lens in which the field-of-view of the lens includes the object of interest), elevation, and azimuth. At 612, the process uses the direction, azimuth, and elevation to determine directional Ambisonic signals. At 614, the process filters and masks a first of the directive Ambisonic signals based on the magnification amount to create a magnified Ambisonic signal. For example, in FIG. 2, the directive Ambisonic conversion 212 uses the captured audio data 128, the direction 138, the azimuth 140, and the elevation 142 to determine the directed FOA signal 213. The filter and mask 214 modify the directed FOA signal 213 based on the magnification 136 to magnify (e.g., zoom in on) the audio 120 (e.g., from the object of interest) relative to the interference 124 (e.g., from other objects).

At 616, the process convolves (1) the binaural signal with (2) the magnified Ambisonic signal to create convolved signals. At 618, the process use uses a second compressor on the convolved signals to create second compressed signals. For example, in FIG. 4, the linked mode convolution 216 convolves the binaural signal 206 with the filtered signal 215 (e.g., a result of the filter and mask 214) to create the convolved signal 217. The second multiband compressor 218 performs compression (e.g., MBDRC) on the convolved signal to 17 to create the second compressed signal 219.

At 620, the process selects, based on one or more criteria, either the first compressor signals or the second compressor. At 622, the selected signal is output. If the second compressor is selected, the selected signal, that includes sound emanating from a direction of the object of interest, is magnified based on the magnification amount. For example, in FIG. 5, if the second signal 219 is in the critical region 506, then the selector 210 selects the first multiband compressor 208 to perform multiband dynamic range compression. If the second signal 219 is not in the critical region 506, then the selector 210 selects the second compressor 218.

FIG. 7 illustrates an example process 700 to determine directive Ambisonic coefficients, according to aspects of the disclosure. For example, the process 700 may be performed by the directive Ambisonic conversion (module) 212 of FIGS. 2 and 3.

At 702, the process receives audio data from a microphone array. The audio data includes (1) audio from an object magnified by a lens that is zoomed in a direction of the object and (2) interference from other objects. At 704, the process converts the audio data into Ambisonic signals. For example, in FIG. 3, the captured audio 128 includes the audio 120 (associated with the object of interest 122 that the lens 110 is zoomed in on in FIG. 1) and the interference 124 (e.g., produced by the other objects 126).

At 706, the process performs super-directive beamforming to the Ambisonic signals based on the lens direction to create a directional signal. At 708, the process determines, based on the lens direction, FOA coefficients. At 710, the process determines, based on the FOA coefficients and the lens direction, three orthogonal FOA components. At 712, the process performs super directive beamforming to the three orthogonal FOA components to create three FOA orthogonal coefficients associated with the interference. At 714, the process determines, using a sidelobe canceler and based on the directional signal and the three FOA orthogonal coefficients, a directive Ambisonic coefficient. For example, in FIG. 3, the first beamforming 302 uses the direction 138 to identify, in the captured audio 128, the first directive component 303. The directive conversion 306 uses the direction 138 to identify, in the captured audio 128, the orthogonal coefficients (e.g., orthogonal to the first directive component 303). The second beamforming 310 performs super-directive beamforming to determine the orthogonal coefficients. The generalized sidelobe canceler 304 is used to reduce the interference, represented by the orthogonal coefficients, in the audio 120 (from the object of interest 122 of FIG. 1), represented by the first directive signal 303.

FIG. 8 illustrates an example process 800 that includes individually convolving a left channel and a right channel of a binaural signal, according to aspects of the disclosure. The process 800 may be performed by the filter and mask (module) 214 and the linked mode convolution 216 of FIGS. 2 and 4.

At 802, the process receives 4 first-order Ambisonic coefficients, including a first coefficient associated with an object magnified by a zoomed in lens and three (remaining) coefficients associated with interference. For example, in FIG. 4, the filter and mask 214 receives the FOA coefficients 312, 314, 316, 318 in which the coefficient 312 is associated with the audio 120 (of the object of interest 122 of FIG. 1) and the coefficients 314, 316, 318 are orthogonal to the coefficient 312 and are associated with the interference 124.

At 804, the process determines the magnification provided by the zoomed in lens. At 806, the process determines a ratio of the first coefficient relative to a sum of the first coefficient with the remaining coefficients. At 808, the process determines whether the ratio is less than 1 and if the ratio is less than 1, then sets the ratio to 1. If the ratio is 1 or greater, then the process does not perform any action. For example, in FIG. 4, the ratio determination module 402 determines, for each of multiple (e.g., 256, 512, or the like) frequencies, the ratio 424 of the first coefficient 312 to the sum of the coefficients 312, 314, 316, 318 using, for example, any equation such as the equation illustrated in FIG. 4. The ratio determination module 402 determines whether the ratio 424 is less than 1. If the ratio determination module 402 determines that the ratio 424 is less than 1 then the ratio determination module 402 sets the ratio for 24 to be 1. If the ratio determination module 402 determines that the ratio 424 is greater than or equal to 1, then the ratio determination module 402 does not modify the ratio 424.

At 810 the process applies a smoothing function based on an attack and a release. For example, in FIG. 4, the smoothing 404 may use the attack 406 and the release 4082 smooth the filtered signal 403 to create the smooth signal 409. The release 408 may be anywhere from 100 ms to one second and the attack 406 may be a fraction (e.g., ⅕, ⅒, or the like) of the amount of the release 408.

At 812, the process performs an IFFT, zeros a last half of the result of performing the IFFT, and performs an FFT to create a filtered signal. At 814, the process a linked convolution by convolving a left channel of a binaural signal with the filtered signal and at 816, convolving a right channel of the binaural signal with the filtered signal. At 818, the process compresses the resulting signal to create a compressed signal. For example, in FIG. 4, the IFFT 410, the zero last half 412, and the FFT 414 may be performed to mask the smoothed signal 409 and provide the filtered signal 215 to the linked mode convolution 216. The linked mode convolution 216 may individually convolve the left and right channels of the binaural signal 206 with the filtered signal 215. The resulting convolved signal 217 is sent to the second multiband compressor 218 to create the second compressed signal 219.

Figure 9:
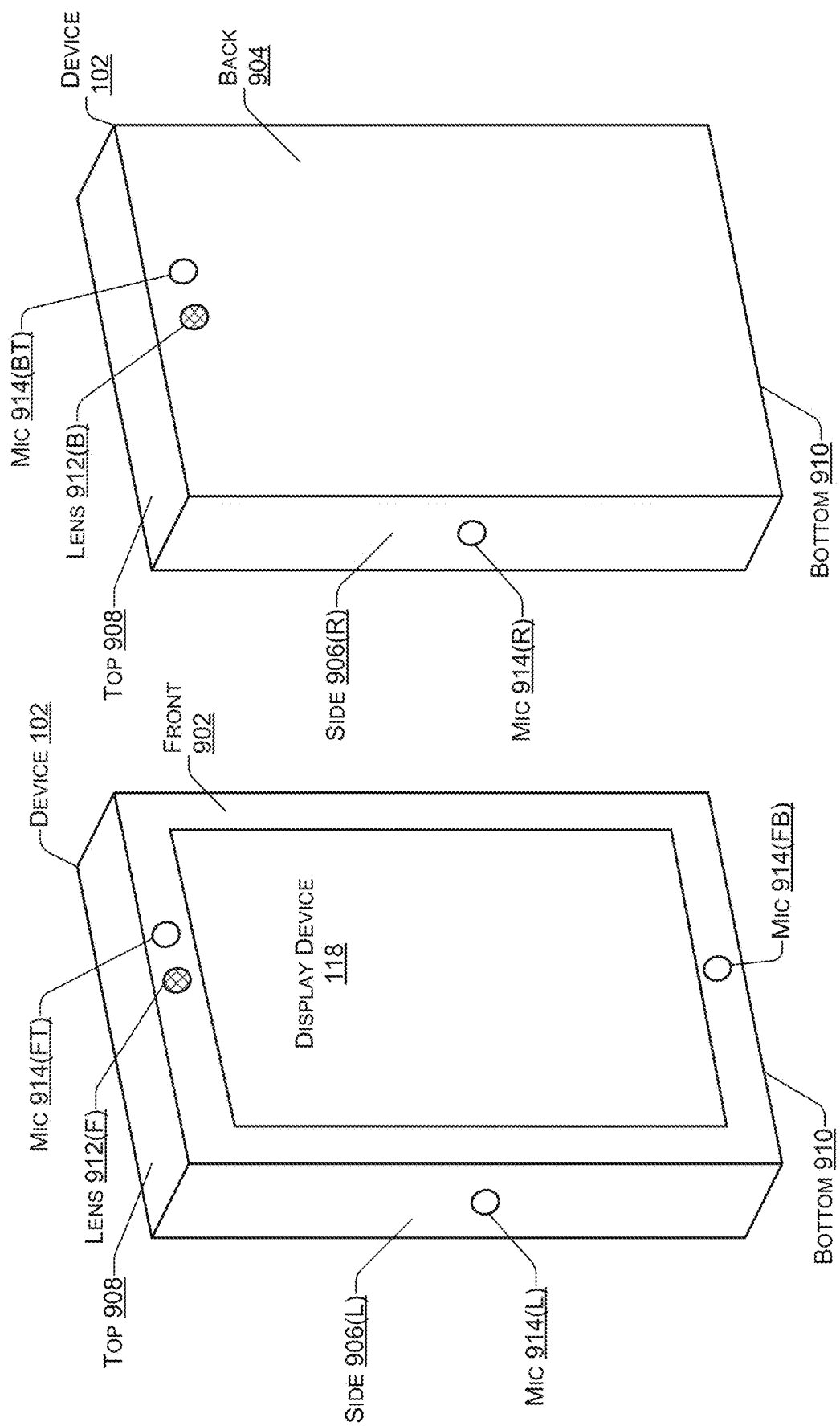
FIG. 9 illustrates an exemplary device that can be used to implement the systems and techniques described herein.

FIG. 9 illustrates an exemplary device (e.g., the device 102 of FIG. 1) that can be used to implement the systems and techniques described herein. The device 102 may be a polyhedron having six mail surfaces, including a front 902, a back 904, a left side 906(L), a right side 906(R), a top 908 and a bottom 910. Multiple lenses may be included in the housing of the device 102. For example, as illustrated in FIG. 9, a front lens 912(F) may be located on the front 902 of the device 102 and a back lens 912(B) may be located on the back 904 of the device 102. Multiple microphones may be included in the housing of the device 102. For example, as illustrated in FIG. 9, a first microphone ("mic") 914(FT) may be located on the front 902 near the top 908, a second mic 914(FB) may be located on the front 902 near the bottom 910, a third mic 914(L) may be located on the left side 906(L), and a fourth microphone 914(R) may be located on the right side 906(R). Of course, other placements are possible for the lenses 912 and the microphones 914 on the device 102. The microphones 914 are collectively referred to herein as the microphone array 104. The lens 112 as used herein references one of the lenses 912.

Figure 10:
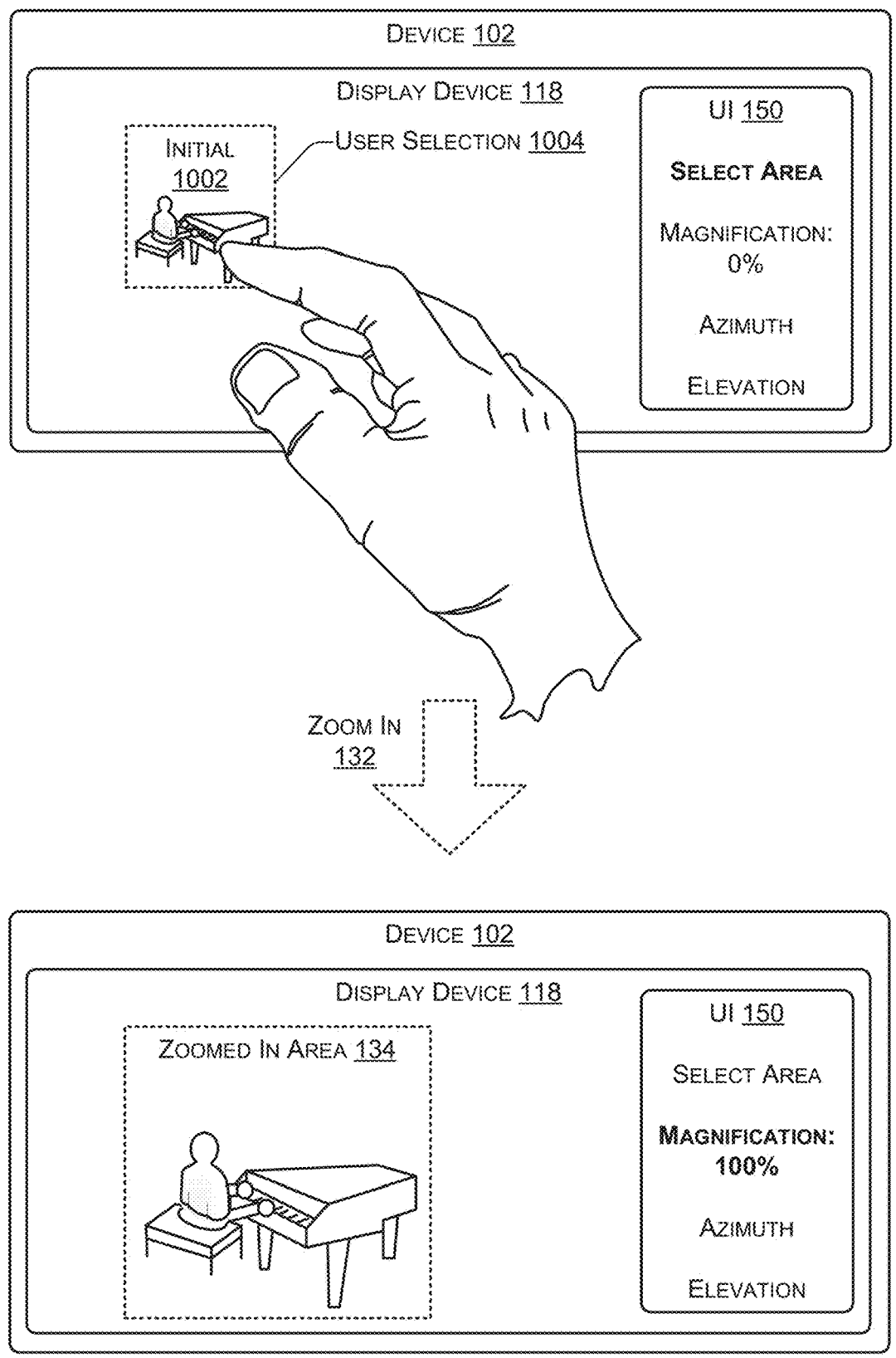
FIG. 10 illustrates performing a zoom in using a user interface, according to aspects of the disclosure.

FIG. 10 illustrates performing a zoom in using a user interface, according to aspects of the disclosure. The UI 150 may enable a user to select the initial area 1002 to create a user selection 1004 and perform the zoom in 132 to create the zoomed in area 1004. The UI 150 may display an amount of the magnification (e.g., the magnification 136 of FIG. 1) of the zoomed in area 1004 relative to the area 1002. The user selection 1004 is used to determine the magnification 136, the direction 138, the azimuth 140, and the elevation 142 of FIG. 1. While a finger is shown creating the user selection 1004 on the touchscreen display device 118, devices other than a smartphone may use different techniques to determine the magnification 136, the direction 138, the azimuth 140, and the elevation 142. For example, if the device 102 takes the form of smart glasses, then gaze tracking (or eye tracking), audio input, and the like may be used to determine one or more of the magnification 136, the direction 138, the azimuth 140, and the elevation 142. To illustrate, the user may direct their gaze to the initial area 1002 and perform a gesture, such as tapping a particular portion of the smart glasses, to create the user selection 1004. The user may then perform a second gesture, such as double tapping the same portion of the smart glasses or tapping a different portion of the smart glasses (e.g., tap a left temple of the smart glasses to select and tap a right temple of the smart glasses) to zoom the user selection 1004 to create the zoomed in area 134.

Figure 11:
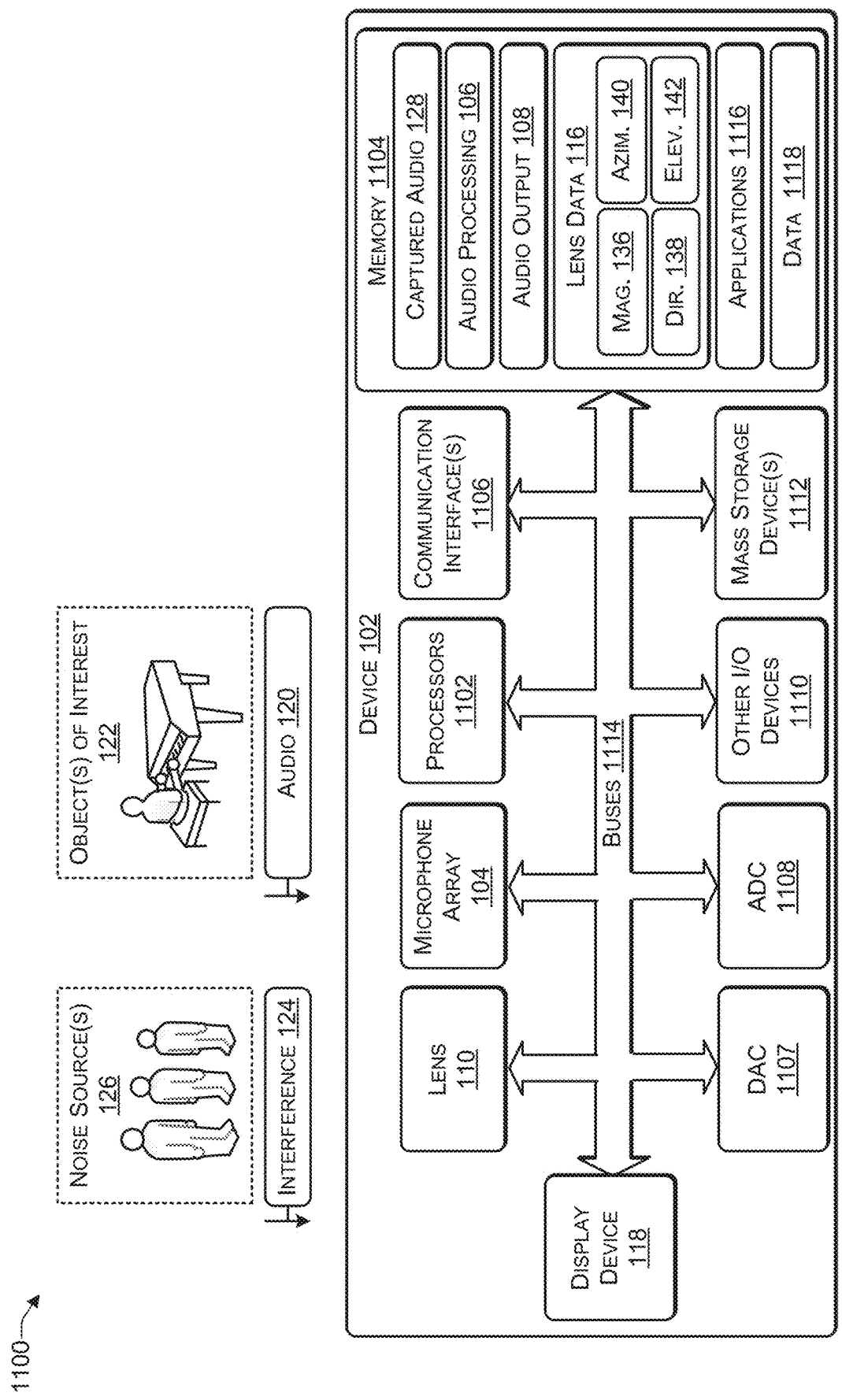
FIG. 11 illustrates an example configuration of a device that can be used to implement the systems and techniques described herein.

FIG. 11 illustrates an example configuration of a device (e.g., the device 102) that can be used to implement the systems and techniques described herein. The device 102 may include one or more processors 1102 (e.g., central processing unit (CPU), graphics processing unit (GPU), digital signal processor (DSP), or the like), a memory 1104, communication interfaces 1106, a display device 1108, other input/output (I/O) devices 1110 (e.g., keyboard, trackball, and the like), and one or more mass storage devices 1112 (e.g., disk drive, solid state disk drive, or the like), configured to communicate with each other, such as via one or more system buses 1114 or other suitable connections. While a single system bus 1114 is illustrated for ease of understanding, it should be understood that the system buses 1114 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 1102 are one or more hardware devices that may include a single processing unit or a number of processing units, all of which may include single or multiple computing units or multiple cores. The processors 1102 may include a GPU, a DSP, or both that are integrated into the CPU or one or more of the GPU or the DSP may be a separate processor device from the CPU. The processors 1102 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 1102 may be configured to fetch and execute computer-readable instructions stored in the memory 1104, mass storage devices 1112, or other non-transitory computer-readable media.

Memory 604 and mass storage devices 612 are examples of computer storage media (e.g., memory storage devices) for storing instructions that can be executed by the processors 602 to perform the various functions described herein. For example, memory 604 may include both volatile memory and non-volatile memory (e.g., RAM, ROM, or the like) devices. Further, mass storage devices 612 may include hard disk drives, solid-state drives, removable media, including external and removable drives, memory cards, flash memory, floppy disks, optical disks (e.g., CD, DVD), a storage array, a network attached storage, a storage area network, or the like. Both memory 604 and mass storage devices 612 may be collectively referred to as memory or computer storage media herein and may be any type of non-transitory media capable of storing computer-readable, processor-executable program instructions as computer program code that can be executed by the processors 602 as a particular machine configured for carrying out the operations and functions described in the implementations herein.

The device 102 may include one or more communication interfaces 606 for exchanging data. The communication interfaces 1106 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 1106 can also provide communication with external storage, such as a storage array, network attached storage, storage area network, cloud storage, or the like.

The display device 118 may be used for displaying content (e.g., information and images) to users. Other I/O devices 1110 may be devices that receive various inputs from a user and provide various outputs to the user, and may include a touchscreen (e.g., associated with the display device 118), a keyboard, a touchpad, a mouse, a printer, audio input/output devices, and so forth.

The computer storage media, such as memory 1104 and mass storage devices 1112, may be used to store software and data. For example, the computer storage media may be used to store the captured audio 128, the audio processing 106, the audio output 108, the lens data 116, other applications 1116 and other data 1118.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Clause 1. A method comprising: determining, by a device comprising a lens and a microphone array, that a field-of-view of the lens has been zoomed in to create a zoomed lens, wherein lens data associated with the zoomed lens comprises a lens direction and a magnification; receiving audio signals from the microphone array; determining, based on the audio signals, a set of first order ambisonic coefficients; determining, based on the lens direction: a directional component of the set of first order ambisonic coefficients; and three orthogonal components of the set of first order ambisonic coefficients, wherein the three orthogonal components are orthogonal to the directional component of the set of first order ambisonic coefficients; modifying the audio signals based on the directional component and the three orthogonal components to create a zoomed audio signal; compressing, by a multiband dynamic range compressor, the zoomed audio signal to create a compressed signal; and outputting the compressed signal.

Clause 2. The method of clause 1, further comprising: converting the audio signals to first order ambisonic signals; and converting, based on an azimuth and an elevation included in the lens data, the first order ambisonic signals to a binaural signal.

Clause 3. The method of any of clauses 1 to 2, further comprising: performing, based on the lens direction, a first beamforming to determine the directional component of the set of first order ambisonic coefficients; performing, based on the lens direction, a second beamforming to determine the three orthogonal components of the set of first order ambisonic coefficients; and modifying, using a sidelobe canceller and based on the three orthogonal components, the directional component to reduce interference in the directional component.

Clause 4. The method of clause 3, further comprising: filtering the set of first order ambisonic coefficients based on: determining a ratio of: the directional component; to a sum of: the directional component, and the three orthogonal components; and based on determining that the ratio is less than 1, setting the ratio to 1 to create a filtered signal.

Clause 5. The method of clause 4, further comprising performing a linked mode convolution comprising: converting the audio signals to a binaural signal; convolving a left channel of the binaural signal with the filtered signal to create a left convolved signal; and convolving a right channel of the binaural signal with the filtered signal to create a right convolved signal.

Clause 6. The method of any of clauses 1 to 5, further comprising: determining that the compressed signal exceeds a distortion threshold; and selecting a different multiband dynamic range compressor to produce the compressed signal.

Clause 7. The method of any of clauses 1 to 6, wherein: the microphone array comprises at least three microphones including: a first microphone located on a front of the device; a second microphone located on a back of the device; and a third microphone located on a side of the device.

Clause 8. The method of any of clauses 1 to 7, wherein: the field-of-view of the zoomed lens includes an object of interest; the lens direction indicates an orientation of the lens relative to the object of interest; and the directional component is associated with audio produced by the object of interest; and the three orthogonal components are associated with interference produced by other objects.

Clause 9. The method of any of clauses 1 to 8, wherein the device comprises smart glasses worn by a user and the method further comprises: tracking a gaze of the user to determine the lens direction of the lens; receiving a selection command selecting the field-of-view of the lens based on the gaze of the user; based on receiving a zoom command from the user, zooming in from a first field-of-view to a second field-of-view that is narrower than the first field-of-view to create the zoomed lens; determining an elevation associated with the field-of-view of the zoomed lens; and determining an azimuth associated with the field-of-view of the zoomed lens.

Clause 10. An apparatus comprising a memory and at least one processor communicatively coupled to the memory, the memory and the at least one processor configured to perform a method according to any of clauses 1 to 9.

Clause 11. An apparatus comprising means for performing a method according to any of clauses 1 to 9.

Clause 12. A non-transitory computer-readable medium storing computer-executable instructions, the computer-executable comprising at least one instruction for causing a computer or processor to perform a method according to any of clauses 1 to 9. In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. A method comprising:
   determining, by a device comprising a lens and a microphone array, that a field-of-view of the lens has been zoomed in to create a zoomed lens, wherein lens data associated with the zoomed lens comprises a lens direction and a magnification;
   receiving audio signals from the microphone array;
   determining, based on the audio signals, a set of first order ambisonic coefficients associated with an object and at least one interfering object;
   determining
      a directional component associated with the set of first order ambisonic coefficients associated with the object and based upon the lens direction; and
      three orthogonal components of the set of first order ambisonic coefficients, wherein the three orthogonal components are orthogonal to the directional component of the set of first order ambisonic coefficients;
   modifying the audio signals based on the directional component, the magnification, and the three orthogonal components to create a zoomed audio signal; and
   outputting the zoomed audio signal.

2. The method of claim 1, further comprising:
   converting the audio signals to first order ambisonic signals; and
   converting, based on an azimuth and an elevation included in the lens data, the first order ambisonic signals to a binaural signal.

3. The method of claim 1, further comprising:
   performing, based on the lens direction, a first beamforming to determine the directional component of the set of first order ambisonic coefficients;
   performing, based on the lens direction, a second beamforming to determine the three orthogonal components of the set of first order ambisonic coefficients; and
   modifying, using a sidelobe canceller and based on the three orthogonal components, the directional component to reduce interference in the directional component.

4. The method of claim 3, further comprising:
   filtering the set of first order ambisonic coefficients based on:
      determining a ratio of:
         the directional component; to
         a sum of:
            the directional component, and
            the three orthogonal components; and
      based on determining that the ratio is less than 1, setting the ratio to 1 to create a filtered signal.

5. The method of claim 4, further comprising performing a linked mode convolution comprising:
   converting the audio signals to a binaural signal;
   convolving a left channel of the binaural signal with the filtered signal to create a left convolved signal; and
   convolving a right channel of the binaural signal with the filtered signal to create a right convolved signal.

6. The method of claim 1, wherein:
   the microphone array comprises at least three microphones including:
      a first microphone located on a front of the device;
      a second microphone located on a back of the device; and
      a third microphone located on a side of the device.

7. The method of claim 1, wherein:
   the field-of-view of the zoomed lens includes an object of interest;
   the lens direction indicates an orientation of the lens relative to the object of interest; and
   the directional component is associated with audio produced by the object of interest; and
   the three orthogonal components are associated with interference produced by other objects.

8. The method of claim 1, wherein the device comprises smart glasses worn by a user and the method further comprises:
   tracking a gaze of the user to determine the lens direction of the lens;
   receiving a selection command selecting the field-of-view of the lens based on the gaze of the user;
   based on receiving a zoom command from the user, zooming in from a first field-of-view to a second field-of-view that is narrower than the first field-of-view to create the zoomed lens;
   determining an elevation associated with the field-of-view of the zoomed lens; and
   determining an azimuth associated with the field-of-view of the zoomed lens.

9. A device comprising:
   a lens;
   a microphone array;
   one or more processors; and
   a computer-readable storage medium to store instructions executable by the one or more processors to perform operations comprising:
      determining that a field-of-view of the lens has been zoomed in to create a zoomed lens, wherein lens data associated with the zoomed lens comprises a lens direction and a magnification;
      receiving audio signals from the microphone array;
      determining, based on the audio signals, a set of first order ambisonic coefficients associated with an object and at least one interfering object;
      determining:
         a directional component associated with the set of first order ambisonic coefficients associated with the object and based upon the lens direction; and
         three orthogonal components of the set of first order ambisonic coefficients, wherein the three orthogonal components are orthogonal to the directional component of the set of first order ambisonic coefficients;
      modifying the audio signals based on the directional component, the magnification, and the three orthogonal components to create a zoomed audio signal; and
      outputting the zoomed audio signal.

10. The device of claim 9, wherein:
    the lens data further comprises an azimuth and an elevation; and
    the operations further comprising:
       converting the audio signals to first order ambisonic signals; and
       converting, based on the azimuth and the elevation, the first order ambisonic signals to a binaural signal.

11. The device of claim 9, further comprising:
    performing, based on the lens direction, a first beamforming to determine the directional component of the set of first order ambisonic coefficients;
    performing, based on the lens direction, a second beamforming to determine the three orthogonal components of the set of first order ambisonic coefficients; and modifying, using a sidelobe canceller and based on the three orthogonal components, the directional component to reduce interference in the directional component.

12. The device of claim 11, the operations further comprising:
filtering the set of first order ambisonic coefficients based on:
determining a ratio based on:
the directional component; to
a sum of:
the directional component, and
the three orthogonal components; and
based on determining that the ratio is less than 1, setting the ratio to 1 to create a filtered signal.

13. The device of claim 12, the operations further comprising performing a linked mode convolution comprising:
converting the audio signals to a binaural signal;
convolving a left channel of the binaural signal with the filtered signal to create a left convolved signal; and
convolving a right channel of the binaural signal with the filtered signal to create a right convolved signal.

14. The device of claim 9, wherein:
the microphone array comprises at least three microphones including:
a first microphone located on a front of the device;
a second microphone located on a back of the device; and
a third microphone located on a side of the device.

15. The device of claim 9, wherein:
the field-of-view of the zoomed lens includes an object of interest;
the lens direction indicates an orientation of the lens relative to the object of interest; and
the directional component is associated with audio produced by the object of interest; and
the three orthogonal components are associated with interference produced by other objects.

16. The device of claim 9, wherein:
the device comprises smart glasses worn by a user; and
the operations further comprising:
tracking a gaze of the user to determine the lens direction of the lens;
receiving a selection command selecting the field-of-view of the lens based on the gaze of the user;
based on receiving a zoom command from the user, zooming in from a first field-of-view to a second field-of-view that is narrower than the first field-of-view to create the zoomed lens;
determining an elevation associated with the field-of-view of the zoomed lens; and
determining an azimuth associated with the field-of-view of the zoomed lens.

17. A non-transitory computer-readable storage medium to store instructions executable by one or more processors to perform operations comprising:
determining, by a device comprising a lens and a microphone array, that a field-of-view of the lens has been zoomed in to create a zoomed lens, wherein lens data associated with the zoomed lens comprises a lens direction and a magnification;
receiving audio signals from the microphone array;
determining, based on the audio signals, a set of first order ambisonic coefficients associated with an object and at least one interfering object;

determining:
a directional component associated with the set of first order ambisonic coefficients associated with the object and based upon the lens direction; and
three orthogonal components of the set of first order ambisonic coefficients, wherein the three orthogonal components are orthogonal to the directional component of the set of first order ambisonic coefficients;
modifying the audio signals based on the directional component, the magnification, and the three orthogonal components to create a zoomed audio signal; and
outputting the zoomed audio signal.

18. The non-transitory computer-readable storage medium of claim 17, wherein:
the lens data further comprises an azimuth and an elevation; and
the operations further comprise:
converting the audio signals to first order ambisonic signals; and
converting, based on the azimuth and the elevation, the first order ambisonic signals to a binaural signal.

19. The non-transitory computer-readable storage medium of claim 17, the operations further comprising:
performing, based on the lens direction, a first beamforming to determine the directional component of the set of first order ambisonic coefficients;
performing, based on the lens direction, a second beamforming to determine the three orthogonal components of the set of first order ambisonic coefficients; and
modifying, using a sidelobe canceller and based on the three orthogonal components, the directional component to reduce interference in the directional component.

20. The non-transitory computer-readable storage medium of claim 19, the operations further comprising:
filtering the set of first order ambisonic coefficients based on:
determining a ratio based on:
the directional component; to
a sum of:
the directional component, and
the three orthogonal components; and
based on determining that the ratio is less than 1, setting the ratio to 1 to create a filtered signal.

21. The non-transitory computer-readable storage medium of claim 20, the operations further comprising performing a linked mode convolution comprising:
converting the audio signals to a binaural signal;
convolving a left channel of the binaural signal with the filtered signal to create a left convolved signal; and
convolving a right channel of the binaural signal with the filtered signal to create a right convolved signal.

22. The non-transitory computer-readable storage medium of claim 17, wherein:
the microphone array comprises at least three microphones including:
a first microphone located on a front of the device;
a second microphone located on a back of the device; and
a third microphone located on a side of the device.

23. The non-transitory computer-readable storage medium of claim 17, wherein:
the field-of-view of the zoomed lens includes an object of interest;
the lens direction indicates an orientation of the lens relative to the object of interest; and the directional component is associated with audio produced by the object of interest; and the three orthogonal components are associated with interference produced by other objects.

24. The non-transitory computer-readable storage medium of claim 17, wherein:

the device comprises smart glasses worn by a user; and the operations further comprise:

tracking a gaze of the user to determine the lens direction of the lens;

receiving a selection command selecting the field-of-view of the lens based on the gaze of the user;

based on receiving a zoom command from the user, zooming in from a first field-of-view to a second field-of-view that is narrower than the first field-of-view to create the zoomed lens;

determining an elevation associated with the field-of-view of the zoomed lens; and determining an azimuth associated with the field-of-view of the zoomed lens.

* * * * *